(12) United States Patent
Ferguson et al.

(10) Patent No.: US 8,531,297 B2
(45) Date of Patent: Sep. 10, 2013

(54) HIGH-SPEED RFID CIRCUIT PLACEMENT METHOD AND DEVICE

(75) Inventors: Scott Wayne Ferguson, Pasadena, CA (US); Ralf Linkmann, Biebertal (DE); Werner Kiehne, Herborn (DE)

(73) Assignee: Avery Dennison Corporation, Pasadena, CA (US)

( * ) Notice: Subject to any disclaimer, the term of this patent is extended or adjusted under 35 U.S.C. 154(b) by 970 days.

(21) Appl. No.: 12/607,534

(22) Filed: Oct. 28, 2009

(65) Prior Publication Data

US 2010/0043203 A1 Feb. 25, 2010

Related U.S. Application Data

(62) Division of application No. 11/148,676, filed on Jun. 9, 2005, now Pat. No. 7,623,034.

(60) Provisional application No. 60/674,429, filed on Apr. 25, 2005.

(51) Int. Cl.
G08B 13/14 (2006.01)

(52) U.S. Cl.
USPC ............... 340/572.1; 340/572.4; 340/572.8; 29/601; 29/832; 29/834; 29/836

(58) Field of Classification Search
USPC ..... 340/572.1, 572.4, 572.7, 572.8; 324/210, 324/227, 667, 765; 156/64, 199, 290, 300; 29/593, 832, 600, 601, 834, 836; 235/380, 235/383, 487, 492
See application file for complete search history.

(56) References Cited

U.S. PATENT DOCUMENTS

| 3,708,860 A | 1/1973 | Bolster et al. |
| 3,724,737 A | 4/1973 | Bodnar |
| 3,891,157 A | 6/1975 | Justus |
| 3,989,575 A | 11/1976 | Davies et al. |
| 4,242,663 A | 12/1980 | Slobodin |

(Continued)

FOREIGN PATENT DOCUMENTS

| EP | 1 035 503 | 9/2000 |
| EP | 1 039 542 | 9/2000 |

(Continued)

OTHER PUBLICATIONS

Sanjay Sarma, Auto-Id Center, Published Nov. 1, 2001, pp. 1-19 "White Paper—Towards the 5 Tag."

(Continued)

Primary Examiner — Hung T. Nguyen
(74) Attorney, Agent, or Firm — Avery Dennison Corporation

(57) ABSTRACT

A high-speed machine and method for placing an RFID circuit onto an electrical component includes separating an RFID circuit from a web of RFID circuits, and placing the RFID circuit onto an electrical component with a placing device. The separating includes directing the RFID circuit onto a transfer drum of the placement device and separably coupling the RFID circuit to the transfer drum. According to one method, a separator device separates and directs chips or interposers onto a placement device. According to another method, chips or interposers are tested before being separated from a web, and if good, are separated from the web, directed onto a placement device, and placed on an electrical component. If defective, the chips or interposers are not directed onto a placement device and are removed by a scrap web removal device.

20 Claims, 8 Drawing Sheets

(56) References Cited

U.S. PATENT DOCUMENTS

| | | |
|---|---|---|
| 4,480,742 A | 11/1984 | Muylle |
| 4,818,312 A | 4/1989 | Benge |
| 4,819,488 A | 4/1989 | Morel |
| 5,153,983 A | 10/1992 | Oyama |
| 5,262,978 A | 11/1993 | Ito |
| 5,264,061 A | 11/1993 | Juskey et al. |
| 5,324,153 A | 6/1994 | Chess |
| 5,409,788 A | 4/1995 | Weiss et al. |
| 5,441,796 A | 8/1995 | Steidinger et al. |
| 5,519,381 A | 5/1996 | Marsh et al. |
| 5,528,222 A | 6/1996 | Moskowitz et al. |
| 5,537,105 A | 7/1996 | Marsh et al. |
| 5,538,806 A | 7/1996 | Weiss et al. |
| 5,545,291 A | 8/1996 | Smith et al. |
| 5,550,547 A | 8/1996 | Chan et al. |
| 5,557,280 A | 9/1996 | Marsh et al. |
| 5,564,888 A | 10/1996 | Doan |
| 5,566,441 A | 10/1996 | Marsh et al. |
| 5,585,193 A | 12/1996 | Joseph et al. |
| 5,604,049 A | 2/1997 | Weiss et al. |
| 5,612,513 A | 3/1997 | Tuttle et al. |
| 5,613,228 A | 3/1997 | Tuttle et al. |
| 5,626,978 A | 5/1997 | Weiss et al. |
| 5,645,932 A | 7/1997 | Uchibori |
| 5,682,143 A | 10/1997 | Brady et al. |
| 5,707,475 A | 1/1998 | Steidinger et al. |
| 5,728,599 A | 3/1998 | Rostoker et al. |
| 5,758,575 A | 6/1998 | Isen et al. |
| 5,766,406 A | 6/1998 | Bohn et al. |
| 5,783,856 A | 7/1998 | Smith et al. |
| 5,824,186 A | 10/1998 | Smith et al. |
| 5,837,349 A | 11/1998 | Van Erden et al. |
| 5,904,545 A | 5/1999 | Smith et al. |
| 5,939,984 A | 8/1999 | Brady et al. |
| 5,946,198 A | 8/1999 | Hoppe et al. |
| 5,963,177 A | 10/1999 | Tuttle et al. |
| 5,972,152 A | 10/1999 | Lake et al. |
| 5,972,156 A | 10/1999 | Brady et al. |
| 5,982,284 A | 11/1999 | Baldwin et al. |
| 5,982,628 A | 11/1999 | Houdeau et al. |
| 6,018,299 A | 1/2000 | Eberhardt |
| 6,019,865 A | 2/2000 | Palmer et al. |
| 6,027,027 A | 2/2000 | Smithgall |
| 6,040,773 A | 3/2000 | Vega et al. |
| 6,043,746 A | 3/2000 | Sorrells |
| 6,045,652 A | 4/2000 | Tuttle et al. |
| 6,078,259 A | 6/2000 | Brady et al. |
| 6,081,243 A | 6/2000 | Lake |
| 6,082,660 A | 7/2000 | Meyer |
| 6,091,332 A | 7/2000 | Eberhardt et al. |
| 6,094,138 A | 7/2000 | Eberhardt et al. |
| 6,104,291 A | 8/2000 | Beauvillier et al. |
| 6,107,920 A | 8/2000 | Eberhardt et al. |
| 6,107,921 A | 8/2000 | Eberhardt et al. |
| 6,121,878 A | 9/2000 | Brady et al. |
| 6,127,024 A | 10/2000 | Weiss et al. |
| 6,130,613 A | 10/2000 | Eberhardt et al. |
| 6,140,146 A | 10/2000 | Brady et al. |
| 6,145,901 A | 11/2000 | Rich |
| 6,147,605 A | 11/2000 | Vega et al. |
| 6,147,662 A | 11/2000 | Grabau et al. |
| 6,154,263 A | 11/2000 | Bailey |
| 6,157,300 A | 12/2000 | Quaderer et al. |
| 6,163,260 A | 12/2000 | Conwell et al. |
| 6,164,137 A | 12/2000 | Hancock et al. |
| 6,164,551 A | 12/2000 | Altwasser |
| 6,165,386 A | 12/2000 | Endo et al. |
| 6,172,608 B1 | 1/2001 | Cole |
| 6,177,859 B1 | 1/2001 | Tuttle et al. |
| 6,189,208 B1 | 2/2001 | Estes et al. |
| 6,206,292 B1 | 3/2001 | Robertz et al. |
| 6,207,001 B1 | 3/2001 | Steidinger et al. |
| 6,215,401 B1 | 4/2001 | Brady et al. |
| 6,218,942 B1 | 4/2001 | Vega et al. |
| 6,236,316 B1 | 5/2001 | Eberhardt et al. |
| 6,246,326 B1 | 6/2001 | Wiklof et al. |
| 6,246,327 B1 | 6/2001 | Eberhardt |
| 6,252,508 B1 | 6/2001 | Vega et al. |
| 6,259,369 B1 | 7/2001 | Monico |
| 6,259,408 B1 | 7/2001 | Brady et al. |
| 6,262,692 B1 | 7/2001 | Babb |
| 6,265,977 B1 | 7/2001 | Vega et al. |
| 6,271,793 B1 | 8/2001 | Brady et al. |
| 6,271,801 B2 | 8/2001 | Tuttle et al. |
| 6,274,508 B1 | 8/2001 | Jacobsen et al. |
| 6,278,413 B1 | 8/2001 | Hugh et al. |
| 6,280,544 B1 | 8/2001 | Fox et al. |
| 6,281,036 B1 | 8/2001 | Niki et al. |
| 6,281,795 B1 | 8/2001 | Smith et al. |
| 6,282,407 B1 | 8/2001 | Vega et al. |
| 6,320,556 B1 | 11/2001 | Cyman et al. |
| 6,331,221 B1 | 12/2001 | Cobbley |
| 6,342,843 B1 | 1/2002 | Hahn et al. |
| 6,366,260 B1 | 4/2002 | Carrender |
| 6,371,375 B1 | 4/2002 | Ackley et al. |
| 6,384,727 B1 | 5/2002 | Diprizio et al. |
| 6,392,545 B2 | 5/2002 | Lake et al. |
| 6,406,935 B2 | 6/2002 | Kayanakis et al. |
| 6,410,112 B1 | 6/2002 | Hatfield |
| 6,412,086 B1 | 6/2002 | Friedman et al. |
| 6,416,608 B1 | 7/2002 | Mynott et al. |
| 6,424,263 B1 | 7/2002 | Lee et al. |
| 6,451,154 B1 | 9/2002 | Grabau et al. |
| 6,452,496 B1 | 9/2002 | Van Horn et al. |
| 6,487,681 B1 | 11/2002 | Tuttle et al. |
| 6,496,113 B2 | 12/2002 | Lee et al. |
| 6,501,157 B1 | 12/2002 | Cobbley |
| 6,514,790 B1 | 2/2003 | Plettner et al. |
| 6,523,734 B1 | 2/2003 | Kawai et al. |
| 6,549,176 B2 | 4/2003 | Hausladen |
| 6,557,758 B1 | 5/2003 | Minoco |
| 6,606,247 B2 | 8/2003 | Credelle et al. |
| 6,618,939 B2 | 9/2003 | Uchibori et al. |
| 6,630,887 B2 | 10/2003 | Lake |
| 6,630,910 B2 | 10/2003 | Forster et al. |
| 6,633,740 B2 | 10/2003 | Estabrooks |
| 6,645,327 B2 | 11/2003 | Austin et al. |
| 6,646,554 B1 | 11/2003 | Goff et al. |
| 6,662,430 B2 | 12/2003 | Brady et al. |
| 6,665,193 B1 | 12/2003 | Chung et al. |
| 6,696,952 B2 | 2/2004 | Zirbes |
| 6,717,923 B1 | 4/2004 | Smith |
| 6,720,865 B1 | 4/2004 | Forster et al. |
| 6,739,047 B2 | 5/2004 | Hammond et al. |
| 6,772,663 B2 | 8/2004 | Machamer |
| 6,779,246 B2 | 8/2004 | Debraal |
| 6,781,508 B2 | 8/2004 | Tuttle et al. |
| 6,786,419 B2 | 9/2004 | Kayanakis |
| 6,796,508 B2 | 9/2004 | Muller |
| 6,798,121 B2 | 9/2004 | Nakatani et al. |
| 6,809,045 B1 | 10/2004 | Alam et al. |
| 6,816,380 B2 | 11/2004 | Credelle et al. |
| 6,820,314 B2 | 11/2004 | Ferguson et al. |
| 6,838,989 B1 | 1/2005 | Mays et al. |
| 6,851,617 B2 | 2/2005 | Saint et al. |
| 6,891,110 B1 | 5/2005 | Pennaz et al. |
| 6,951,596 B2 | 10/2005 | Green et al. |
| 6,972,394 B2 | 12/2005 | Brod et al. |
| 7,295,117 B2 * | 11/2007 | Forster et al. ............ 340/572.1 |
| 7,431,784 B2 * | 10/2008 | Melzer et al. ............ 156/64 |
| 7,511,622 B2 * | 3/2009 | Korzeniewski ............ 340/572.8 |
| 2001/0030628 A1 | 10/2001 | Brady et al. |
| 2002/0011677 A1 | 1/2002 | Yokoi et al. |
| 2002/0049093 A1 | 4/2002 | Reyes et al. |
| 2002/0067268 A1 | 6/2002 | Lee et al. |
| 2002/0082368 A1 | 6/2002 | Zahalka |
| 2002/0129488 A1 | 9/2002 | Lieberman |
| 2002/0167405 A1 | 11/2002 | Shanks et al. |
| 2002/0171591 A1 | 11/2002 | Beard |
| 2002/0195194 A1 | 12/2002 | Grabau et al. |
| 2002/0195195 A1 | 12/2002 | Grabau et al. |
| 2003/0034127 A1 | 2/2003 | Segawa |
| 2003/0036249 A1 | 2/2003 | Bauer et al. |
| 2003/0062783 A1 | 4/2003 | Horng et al. |

| | | | | | | |
|---|---|---|---|---|---|---|
| 2003/0080919 | A1 | 5/2003 | Forster et al. | EP | 1 560 155 | 8/2005 |
| 2003/0089444 | A1 | 5/2003 | Melzer et al. | FR | 2 775 533 | 2/1998 |
| 2003/0102541 | A1 | 6/2003 | Gore et al. | FR | 2 806 029 | 9/2001 |
| 2003/0117334 | A1 | 6/2003 | Forster et al. | GB | 2 341 166 | 6/1999 |
| 2003/0121986 | A1 | 7/2003 | Stromberg et al. | JP | 2000-311233 | 11/2000 |
| 2003/0132893 | A1 | 7/2003 | Forster et al. | JP | 2001-035989 | 2/2001 |
| 2003/0136503 | A1 | 7/2003 | Green et al. | JP | 2001-7511 | 12/2001 |
| 2003/0151028 | A1 | 8/2003 | Lawrence et al. | JP | 2002-298104 | 10/2002 |
| 2003/0153269 | A1 | 8/2003 | Smit et al. | JP | 2002 298107 | 10/2002 |
| 2003/0209697 | A1 | 11/2003 | Orsbon et al. | JP | 2003-298107 | 10/2002 |
| 2004/0004294 | A1 | 1/2004 | Hall et al. | JP | 2003 0006594 | 1/2003 |
| 2004/0004295 | A1 | 1/2004 | Stromberg et al. | JP | 2003-059337 | 2/2003 |
| 2004/0005754 | A1 | 1/2004 | Stromberg | JP | 2003 281936 | 3/2003 |
| 2004/0032377 | A1 | 2/2004 | Forster et al. | JP | 2003-281491 | 10/2003 |
| 2004/0037053 | A1 | 2/2004 | Akita et al. | JP | 2003-283120 | 10/2003 |
| 2004/0040740 | A1 | 3/2004 | Nakatani et al. | JP | 2003-283121 | 10/2003 |
| 2004/0041739 | A1 | 3/2004 | Forster et al. | JP | 2003-288570 | 10/2003 |
| 2004/0061655 | A1 | 4/2004 | Forster et al. | JP | 2004 038573 | 2/2004 |
| 2004/0061994 | A1 | 4/2004 | Kerr et al. | JP | 2004-180217 | 6/2004 |
| 2004/0072385 | A1 | 4/2004 | Bauer et al. | JP | 2004-220304 | 8/2004 |
| 2004/0075616 | A1 | 4/2004 | Endo et al. | JP | 2004-334432 | 11/2004 |
| 2004/0089408 | A1 | 5/2004 | Brod et al. | WO | WO 99/41721 | 8/1999 |
| 2004/0102870 | A1 | 5/2004 | Andersen et al. | WO | WO 00/14733 | 3/2000 |
| 2004/0117985 | A1 | 6/2004 | Chung et al. | WO | WO 00/16285 | 3/2000 |
| 2004/0151028 | A1 | 8/2004 | Chih et al. | WO | WO 00/21031 | 4/2000 |
| 2004/0154161 | A1 | 8/2004 | Aoyama et al. | WO | WO 01/54058 | 7/2001 |
| 2004/0155328 | A1 | 8/2004 | Kline | WO | WO 01/61646 | 8/2001 |
| 2004/0173781 | A1 | 9/2004 | Lawrence et al. | WO | WO 01/95241 | 12/2001 |
| 2004/0175515 | A1 | 9/2004 | Lawrence et al. | WO | WO01/95252 | 12/2001 |
| 2004/0175548 | A1 | 9/2004 | Lawrence et al. | WO | WO 02/37414 | 5/2002 |
| 2004/0175550 | A1 | 9/2004 | Lawrence et al. | WO | WO 02/49093 | 6/2002 |
| 2004/0176032 | A1 | 9/2004 | Kotola et al. | WO | WO02/089051 | 7/2002 |
| 2004/0183182 | A1 | 9/2004 | Swindlehurst et al. | WO | WO 02/082368 | 10/2002 |
| 2004/0188531 | A1 | 9/2004 | Gengel et al. | WO | WO 02/093625 | 11/2002 |
| 2004/0192011 | A1 | 9/2004 | Roesner | WO | WO 03/007232 | 1/2003 |
| 2004/0194876 | A1 | 10/2004 | Overmeyer et al. | WO | WO 03/105063 | 12/2003 |
| 2004/0200061 | A1 | 10/2004 | Coleman et al. | WO | WO 03/107266 | 12/2003 |
| 2004/0201112 | A1 | 10/2004 | Divigalpitiya et al. | WO | WO 2004/046762 | 6/2004 |
| 2004/0212544 | A1 | 10/2004 | Pennaz et al. | WO | WO 2004/070797 | 8/2004 |
| 2004/0215350 | A1 | 10/2004 | Roesner | WO | WO 2004/079646 | 9/2004 |
| 2004/0246099 | A1 | 12/2004 | Tuttle | WO | WO 2004/079647 | 9/2004 |
| 2005/0001725 | A1 | 1/2005 | Brady et al. | WO | WO 2004/084128 | 9/2004 |
| 2005/0007296 | A1 | 1/2005 | Endo et al. | WO | WO 2004/088571 | 10/2004 |
| 2005/0021172 | A1 | 1/2005 | Winter et al. | WO | WO 2004/100098 | 11/2004 |
| 2005/0024291 | A1 | 2/2005 | Aisenbrey | WO | WO 2004/100309 | 11/2004 |
| 2005/0155213 | A1 | 7/2005 | Eastin | WO | WO 2005/006248 | 1/2005 |
| 2005/0166391 | A1 | 8/2005 | Berndtsson | WO | WO 2006/036666 | 4/2006 |
| 2005/0252605 | A1 | 11/2005 | Green et al. | | | |
| 2006/0063323 | A1 | 3/2006 | Munn | | | |
| 2006/0213609 | A1 | 9/2006 | Green et al. | | | |

FOREIGN PATENT DOCUMENTS

| | | |
|---|---|---|
| EP | 1 039 543 | 9/2000 |
| EP | 1 063 737 | 12/2000 |
| EP | 1 302 974 | 10/2002 |
| EP | 1 479 040 | 2/2003 |
| EP | 1 382 010 | 1/2004 |
| EP | 1 470 528 | 10/2004 |

OTHER PUBLICATIONS

Charlie Schmidt, "Beyond the Bar Code," Technology Review, Mar. 2001, Twenty-Eight (28) Pages.

International 2000, Nov. 5-9, 2000, Chicago, IL USA, Twelve (12) pages.

Motorola, Grant Milner, Director, BiStatix Business Operations, "How Smart Labels Work", Apr. 17, 2001, Thirty-Two (32) pages.

* cited by examiner

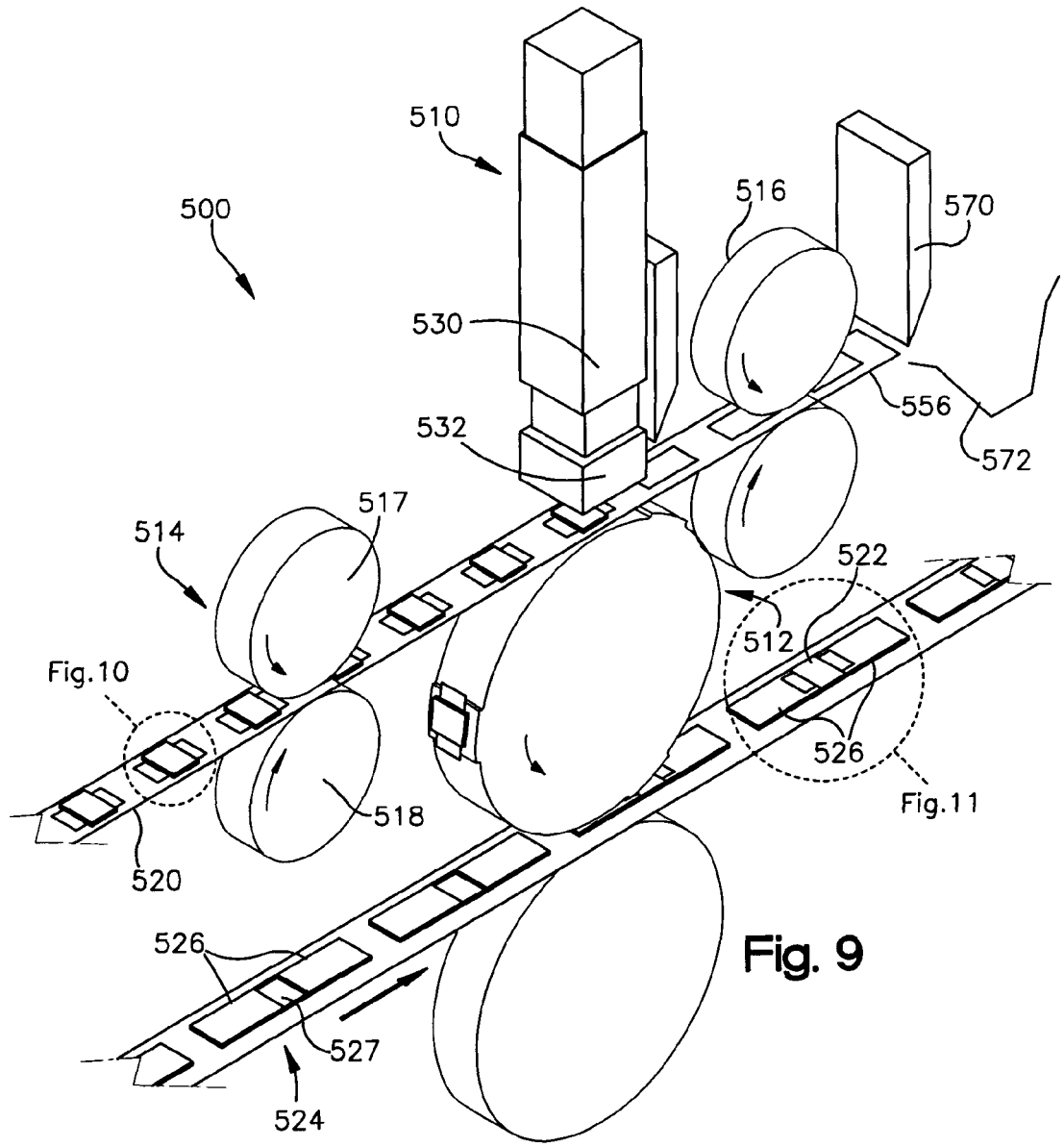
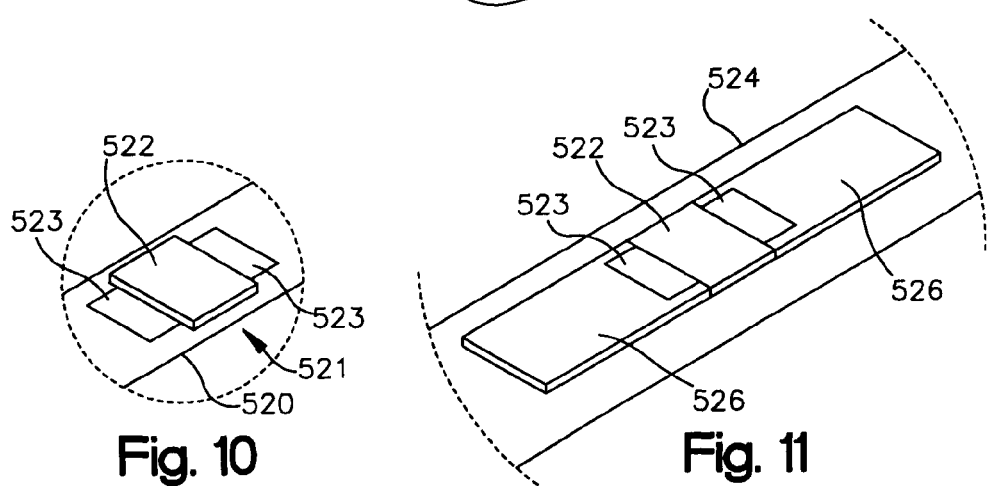
Fig. 9
Fig. 10
Fig. 11

HIGH-SPEED RFID CIRCUIT PLACEMENT METHOD AND DEVICE

CROSS-REFERENCE TO RELATED APPLICATIONS

This application is a divisional of U.S. patent application Ser. No. 11/148,676 filed Jun. 9, 2005, U.S. Pat. No. 7,623,034. U.S. patent application Ser. No. 11/148,676 claims the benefit of U.S. Provisional Patent Application No. 60/674,429 filed Apr. 25, 2005. All of said applications are incorporated herein by reference in their entireties.

BACKGROUND OF THE INVENTION

1. Field of the Invention

The present invention relates generally to the assembly of electronic devices. More particularly, the present invention relates to the assembly of radio frequency identification (RFID) interposers, inlays, tags and labels.

2. Description of the Related Art

Radio frequency identification (RFID) tags and labels (collectively referred to herein as RFID "devices") are widely used to associate an object with an identification code. RFID devices generally have a combination of antennas and analog and/or digital electronics, which may include, for example, communications electronics, data memory, and control logic. RFID devices typically further include structures to support and protect the antennas and electronics, and to mount or attach them to objects. For example, RFID tags may be used in conjunction with the security-locks of cars, for access control to buildings, and for tracking inventory and parcels. Some examples of RFID tags and labels are described in U.S. Pat. Nos. 6,107,920, 6,206,292, and 6,262,292, the disclosures of which are incorporated herein by reference in their entireties.

As noted above, RFID devices are generally categorized as labels or tags. RFID labels are typically substantially planar RFID devices that are adhesively or otherwise attached directly to objects. RFID tags, in contrast, are secured to objects by other means, for example, by use of a plastic fastener, a band, or by other fastening means.

In many applications, the size and shape (i.e., the form factor) of RFID devices, and their mechanical properties, such as flexibility, are critical. For reasons such as security, aesthetics, and manufacturing efficiency, there is a strong tendency toward smaller form factors. Where thinness and flexibility are desired, it is important to avoid materials (such as bulky electronics) and constructions that add undue thickness or stiffness to the RFID tag or label. On the other hand, RFID devices must have robust electrical connections, mechanical support, and appropriate positioning of the components (i.e., the chips, chip connectors, antennas) to withstand, e.g., the rigors of shipping and handling. Structures for these purposes can add complexity, thickness and inflexibility to an RFID device.

Another significant form factor, for example, in thin flat tags and labels, is the area of the device, and the performance requirements of the antenna can affect this factor significantly. For example, in the case of a dipole antenna, the antenna typically should have a physical length approximately one-half wavelength of the RF device's operating frequency.

RFID tags and labels typically include an integrated circuit microchip ("chip") electrically coupled to an antenna. Typically, the antennas are provided on a continuous sheet or web, and the RFID circuit is precisely placed onto a particular antenna using commercially available pick-and-place machines. These machines are relatively slow, and usually require an intermittent indexing process whereby the antenna web stops for a short period of time while the chip is placed onto an antenna on the antenna web. Since the spacing of antennas on the antenna web can be relatively large, for example, 5 to 8 cm (2 to 3 inches) apart, the speed of the production process is further reduced because the antenna web must move a relatively large distance for the next placement operation to take place. Pick and place equipment generally has the highest placement rate when the chip placement locations are very close together.

In many applications it is desirable to reduce the size of the electronics as much as possible. In order to interconnect very small chips with antennas in RFID inlays, it is known to use an intermediate interconnective or coupling structure, variously called an "interposer", "strap", and "carrier", to facilitate device manufacture. Interposers include conductive leads or pads that are electrically coupled to the input/output ("1/0") contact pads of the chips for coupling to the antennas. These pads may be used to provide a larger effective electrical contact area than a chip precisely aligned for direct placement without an interposer. The larger coupling area provided by the interposer effectively reduces the accuracy required for the placement of a chip during manufacture while still providing an effective electrical connection between the chip and an antenna. Chip placement and mounting are serious limitations for high-speed manufacture. The prior art discloses a variety of RFID strap or interposer structures, typically using a flexible substrate that carries the strap's contact pads or leads. RFID devices incorporating straps or interposers are disclosed, for example, in U.S. Pat. No. 6,606,247 and in European Patent Publication 1 039 543, both of which are incorporated by reference herein in their entireties.

One method for forming an RFID device is described in International Application Serial No. PCT/US03/01513 filed on 17 Jan. 2003. In PCT/US03/01513 chips or interposers are singulated from a first web and transferred to antennas on a second web. The pitch of the chips or interposers on the first web is generally smaller than the pitch of the antennas on the second web. The chips or interposers are generally singulated and transferred to the second web by a continuously moving transfer member that picks and places the chips or straps onto the antennas on the second web. The chips or straps are indexed to the antennas by the transfer member.

Another method of placing an RFID circuit onto an electrical component is described in U.S. patent application Ser. No. 10/947,010 filed on 22 Sep. 2004. In Ser. No. 10/947,010, a transfer drum transfers chips or interposers to a moving web of electrical components by picking a chip when the transfer drum is stationary, and transferring the chip to the moving web when the transfer drum is rotating such that a tangential velocity of the transfer drum is substantially equal to the linear velocity of the moving web. By varying the rate of rotation of the transfer drum, the transfer drum can pick a chip while stationary and place the chip onto an electrical component on the moving web thereby indexing the chip to the electrical component.

Although the use of straps or interposers involves an extra step in the process of attaching an RFID circuit to an antenna, straps or interposers offer an advantage in speed of transfer to the web of antenna structures. A second advantage to the interposer is a reduced requirement for placement accuracy onto the antenna. The respective contact pads of the interposer and antenna can be much larger than those required for the RFID circuit to antenna connection, thereby enabling the use of interposer placement equipment operating at higher speeds and with lower precision requirements.

Interposers offer the advantage that they may be attached to an antenna on a moving web. However, the web speed and production rate are still quite low. Some of the difficulty arises from the difference in spacing of the straps or interposers on the carrier web, and the spacing of the antenna structures to which the interposers will be attached. PCT Application WO 2004/088571 A2, for example, describes a process and apparatus for attaching RFID "modules", i.e., interposer assemblies, to antennas on a moving web.

One method of assembling interposers begins with a web of interposer leads or pads and a web of RFID chips. Typically the RFID chips are separated from the web and placed onto the interposer leads using pick-place techniques. The chip may be placed onto the interposer leads with a rotary pick-place device for picking RFID chips and placing the chips on interposer leads on a web, thereby forming an interposer assembly. Alternatively, a web of chips may be laminated directly to a web of interposer leads.

As used in the specification and claims of the present patent application, the term "RFID circuit" encompasses both an interposer, and an RFID chip electrically coupled to the interposer.

Often the "pitch" of the RFID circuits on a first web, also referred to as the center-to-center distance between adjacent elements, may be different than the pitch of the interposer leads or other electrical components on a second web. The pitch of chips may be different than the pitch of an array of RFID tags or labels to be formed: (a) in the longitudinal (also called the "down web") direction; (b) in the transverse (or "cross web") direction, or (c) in both directions. The difference in pitch may be due to, for example, the size of the elements themselves, manufacturing considerations, and/or efficiency considerations. In general, it is preferable from an efficiency standpoint to have the smallest pitch possible between chips on the first web. Due to the relatively small size of the chips or strap compared to antenna or other electrical elements, the chips or straps are relatively much more closely spaced together. Thus, when placing RFID circuits from a web having a first pitch to an antenna on a web having a second pitch, the chips must be indexed to the antennas, or vice versa. In the interest of efficiency, the indexing process should be performed as seamlessly as possible, preferably without interfering with the advance of the web containing antenna structures.

Therefore, a high-speed method and device is provided for singulating or separating interposers from a first web having a first pitch and transferring the interposers to a transfer device whereby the interposers can be indexed and placed onto electrical components on a second web having a second pitch.

SUMMARY OF THE INVENTION

In accordance with exemplary embodiments of the present invention, a method is provided for placing an RFID circuit onto an electrical component. The method includes separating an RFID circuit from a web of RFID circuits and placing the RFID circuit onto an electrical component with a placement device. The separating includes directing the RFID circuit onto a transfer drum of the placement device and separably coupling the RFID circuit to the transfer drum.

In another exemplary embodiment, a novel machine for making an RFID device is provided including an RFID circuit separation device and a rotary placement device. The RFID circuit separation device includes a punch member configured to separate at least one RFID circuit from a web of RFID circuits and direct the at least one RFID circuit onto a transfer drum of the rotary placement device.

In another exemplary embodiment, a machine is provided for making an RFID device including a web advancement device configured to advance a web of RFID circuits through an RFID circuit separation device, and a scrap web removal device downstream of the RFID circuit separation device. The web advancement device and scrap web removal device are configured to cooperatively advance the web of RFID circuits through the RFID circuit separation device to prevent buckling of the web of RFID circuits as the web of RFID circuits passes through the RFID circuit separation device.

In yet another exemplary embodiment, a method is provided for making an RFID device. The method includes testing an RFID circuit that is on a web of RFID circuits. If the RFID circuit is determined by the testing to be non-defective, then positioning the non-defective RFID circuit in an RFID circuit separation device, separating the non-defective RFID circuit from the web of RFID circuits with a punch member, directing the non-defective RFID circuit onto a rotary placement device with the punch member, and placing the non-defective RFID circuit onto an electrical component with the rotary placement device. If the RFID circuit is determined by the testing to be defective, then advancing the defective RFID circuit to a scrap RFID web removal device, and removing the defective RFID circuit from the web with the scrap RFID web removal device.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings, wherein like reference numerals are used to identify like elements illustrated in one or more of the figures.

BRIEF DESCRIPTION OF THE DRAWINGS

FIG. 9 is an oblique view of another exemplary embodiment in accordance with the present invention;

FIG. 10 is an enlarged view of the interposer web of the embodiment of FIG.

FIG. 11 is enlarged view of an interposer on the antenna web of the embodiment of FIG. 9.

DETAILED DESCRIPTION OF THE INVENTION

A high-speed machine and method for placing an RFID circuit onto an electrical component includes separating an RFID circuit from a web of RFID circuits, and placing the RFID circuit onto an electrical component with a placing device. The separating includes directing the RFID circuit onto a transfer drum of the placement device and separably coupling the RFID circuit to the transfer drum. According to one method, a separator device separates and directs chips or interposers onto a placement device. According to another method, chips or interposers are tested before being separated from a web, and if good, are separated from the web, directed onto a placement device, and placed on an electrical component. If defective, the chips or interposers are not directed onto a placement device and are removed by a scrap web removal device.

Figure 1:
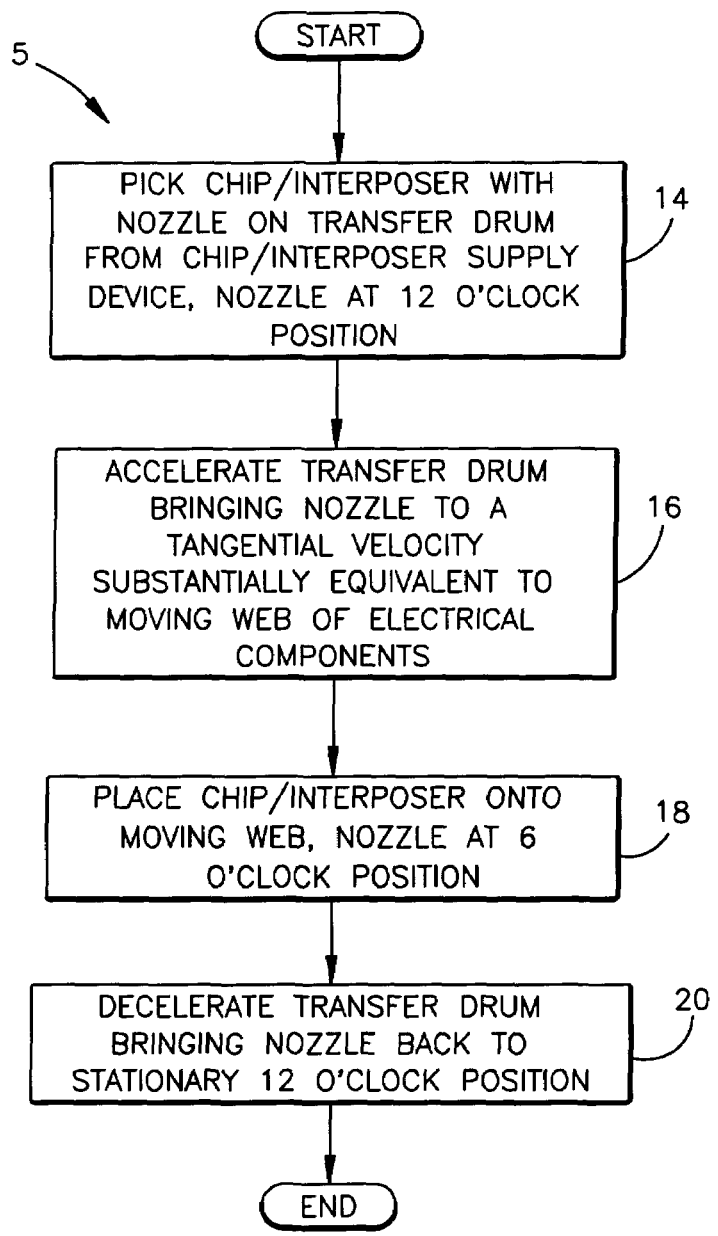
FIG. 1 is a flow chart illustrating a method of picking a chip or an interposer from a supply device and placing it on an electrical component disposed on a moving web in accordance with an exemplary embodiment of the present invention.

In FIG. 1, a flow chart is shown depicting a method 5 of placing an RFID circuit onto an antenna disposed on a moving web. The method 5 of FIG. 1 will be described in relation to a transfer drum having a single vacuum port or nozzle. However, it should be understood that the method 5, with certain modifications, is equally applicable to any single nozzle of a multi-nozzle transfer drum. In the case of a multi-nozzle transfer drum the accelerate step 16 and the decelerate step 20 would be repeated over multiple cycles (generally corresponding to the number of nozzles) before the given nozzle returns to the 12 o'clock position. The step 18 of placing the chip/interposer onto a moving web would take place following the accelerate step 16 of one of these cycles. Further, while the method is described with reference to nozzles or ports actuated by negative or positive pressures to respectively grasp and release the transferred components, the method does not require such nozzles or ports, but is compatible with other component grasp and release mechanisms, as well.

The method 5 begins in process step 14 wherein an RFID circuit, comprising an RFID chip or an RFID interposer circuit, dispensed from, e.g., a supply magazine of such circuits, is picked up by a nozzle on a transfer drum. In this embodiment, the transfer drum is momentarily stationary when an RFID circuit is picked up by the nozzle in the 12 o'clock position on the transfer drum. In process step 16, the transfer drum is accelerated such that the tangential velocity of the nozzle is substantially equal to the linear velocity of a moving web of electronic components when the nozzle reaches the 6 o'clock position. The RFID circuit is then transferred from the nozzle to the moving web of electronic components in process step 18. After the RFID circuit is transferred to the moving web of electronic devices, the transfer drum is decelerated, in process step 20, such that the nozzle is returned to the 12 o'clock position, whereat the nozzle is in position to pick up another chip for transfer to the moving web of electrical components.

In one implementation of the nozzle of the transfer drum, the nozzle is a vacuum holder that engages and releases RFID circuits using negative and positive pressures, respectively. However, the invention also encompasses mechanical separable coupling of the RFID circuit to the transfer drum, and as used in this patent application the term "nozzle" encompasses not only vacuum separable coupling but also mechanical, electromagnetic and electrostatic separable coupling of RFID circuits.

Figure 2A:
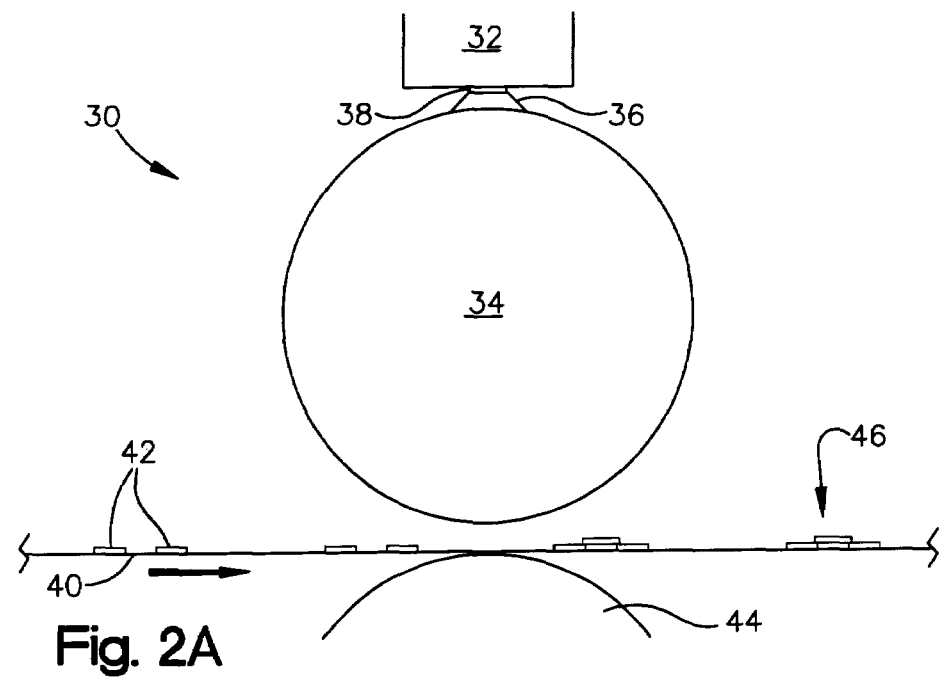
FIG. 2A is a partial side elevation view of a single drum, one nozzle placement device according to the present invention, shown disposed in a first rotational position.
Figure 2B:
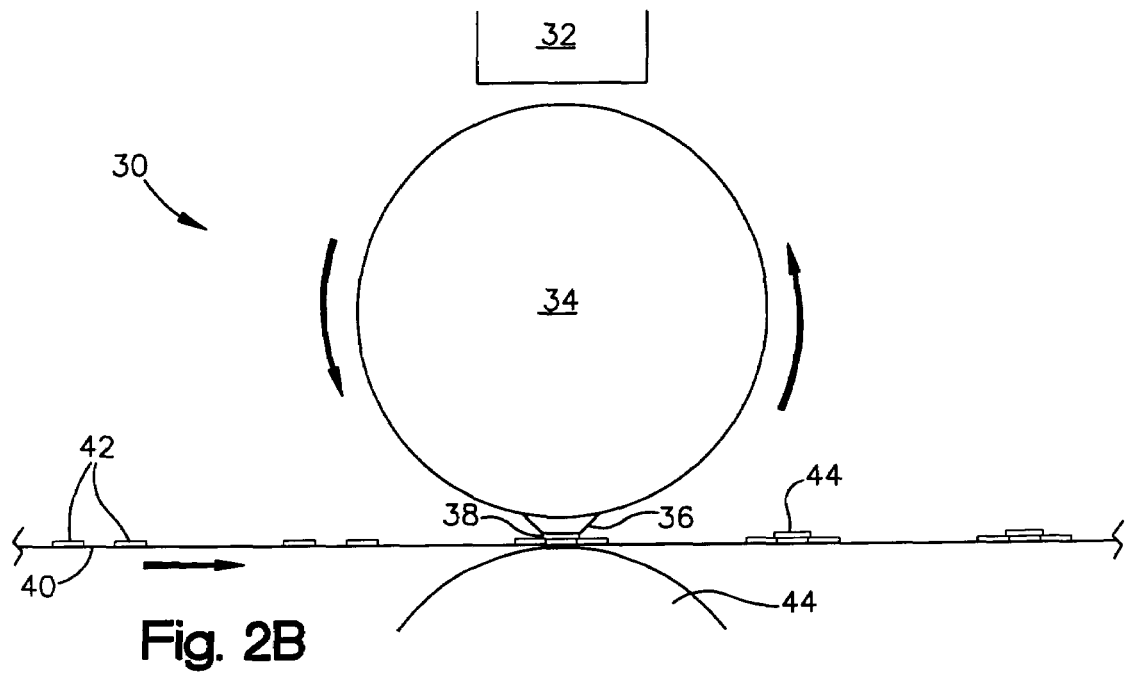
FIG. 2B is a partial side elevation view of the single drum, one nozzle placement device of FIG. 2A, shown disposed in a second rotational position.

Turning to FIGS. 2A and 2B, a high-speed placement device 30 is shown, including an RFID circuit supply device 32, such as a interposer magazine, a transfer drum 34 having a single vacuum port or nozzle 36 for transferring RFID circuits 38 from the supply device 32 to a moving web 40 of electronic components 42, and a base roller 44. As shown in FIG. 2A, the transfer drum 34 is positioned between the RFID circuit supply device 32 and the base roller 44, with the nozzle 36 disposed at the 12 o'clock position. The base roller 44 typically rotates clockwise at a suitable speed, thereby advancing the web 40 of electrical components 42 at a constant rate from left to right in the figure. The base roller 44 also can be an idler roller. When rotating, the transfer drum 34 rotates counterclockwise. In the particular embodiment illustrated, the nozzle 36, through the selective application of negative pressure, picks an RFID circuit 38 from the supply device 32 while the transfer drum 34 is momentarily stationary, with the nozzle 36 at the 12 o'clock position. Once an RFID circuit 38 is separably coupled to the nozzle 36, the transfer drum 34 rotates counterclockwise while accelerating to a placement velocity, at which time the nozzle 36 and the RFID circuit 38 have a tangential velocity substantially equal to the linear velocity of the moving web 40. In FIG. 2B, the nozzle 36 with an RFID circuit 38 separably coupled thereto is shown in the 6 o'clock position, with the transfer drum 34 rotating such that the tangential velocity of the nozzle 36 and the RFID circuit 38 is substantially equal to the linear speed of the moving web 40. The RFID circuit 38 is then transferred to an electronic component 42 on the web 40 by selective removal of the negative pressure and/or the application of a positive pressure thereto. In some embodiments, the pressure change on the nozzle may be accompanied by a change in an electrostatic charge on the nozzle to assist in or effect the release of the RFID circuit therefrom. The transfer drum 34 may be situated such that the nozzle 36 forces the RFID circuit 38 against the electrical component 42 on the web 40. The electrical component may include an adhesive that effects a "tacking" of the RFID circuit to the component during the placement. After the RFID circuit 38 is placed, the transfer drum 34 continues rotating counterclockwise, thereby returning the nozzle 36 to the 12 o'clock position, whereat the nozzle 36 is once again stationary and in position to pick up another RFID circuit 38 from the supply device 32.

In the embodiment illustrated, the transfer drum accelerates from zero revolutions per minute (RPM's) at the 12 o'clock position, to the placing velocity at the 6 o'clock position, and back to zero RPM's at the 12 o'clock position. Thus, the transfer drum 34 must accelerate from stationary to placing velocity within 180 degrees of rotation (i.e., between the 12 o'clock picking position and the 6 o'clock placing position). It will be appreciated that the manner in which the placing drum 34 is accelerated and decelerated during one revolution, also referred to herein as the velocity profile of the placing drum, may be any suitable manner depending on a variety of factors such as the total throughput rate of the placement device 30, the rate at which RFID circuits 38 can be supplied to the transfer drum 34, the minimum time required for an RFID circuit 38 to be separably coupled to a vacuum port or nozzle 36 of the transfer drum 34, the pitch of the electrical components, and the like. In some embodiments, the placing drum 34 can be rotated at intermediate velocities faster than the placing velocity at the 6 o'clock position.

Figure 3A:
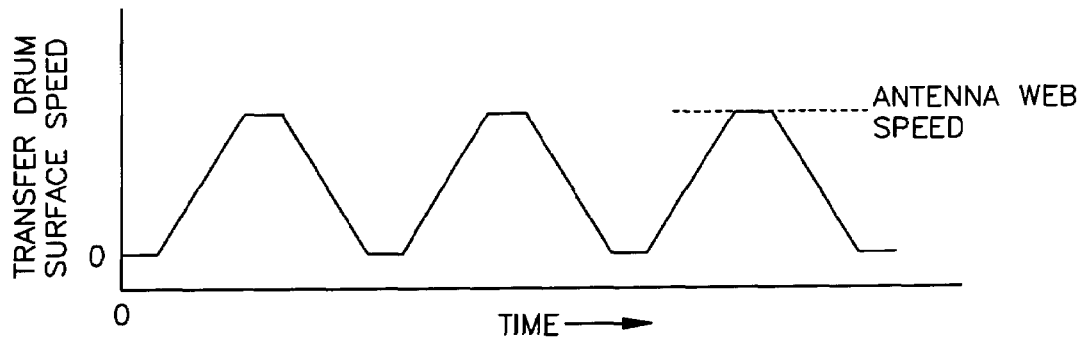
FIG. 3A is a graph illustrating one possible velocity profile of a transfer drum.
Figure 3B:
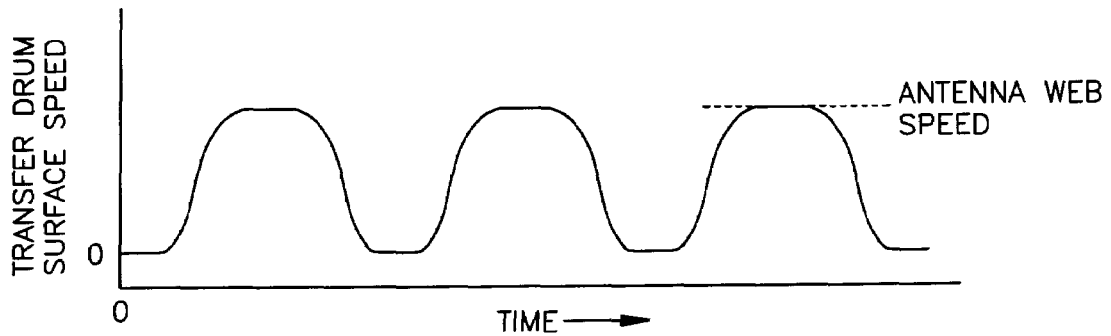
FIG. 3B is a graph illustrating another possible velocity profile of a transfer drum.

In an embodiment in which an RFID circuit is first singulated and then separably coupled to the transfer drum, the velocity profile of the transfer drum typically will include a dwell time, or time interval during which the transfer drum is held stationary to receive and hold the singulated RFID circuit. FIGS. 3A and 3B show two possible exemplary velocity profiles for the transfer drum 34 of FIGS. 2A and 2B. FIG. 3A shows a velocity profile with a straight line increase in velocity from stationary to full speed, while FIG. 3B shows an example of an arcuate velocity profile. Each of these transfer drum velocity profiles are for transfer drums with three nozzles, and the profiles thus include dwell regions at 0°, 120°, and 240° of the rotation cycle. Other transfer drum configurations may also have similar velocity profiles.

Figure 4:
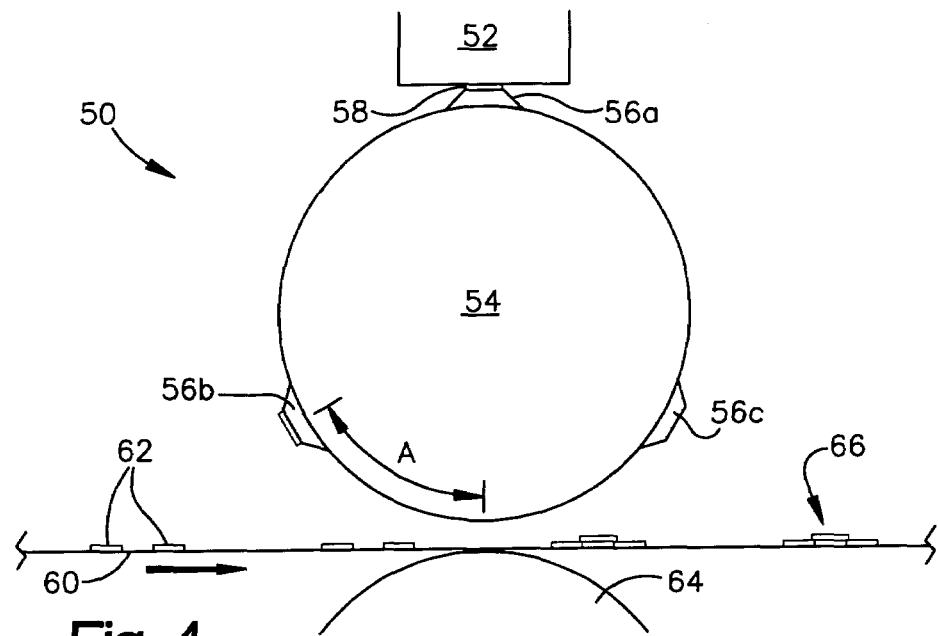
FIG. 4 is a partial side elevation view of a single drum, three nozzle placement device according to the present invention, shown disposed in a first rotational position.
Figure 5:
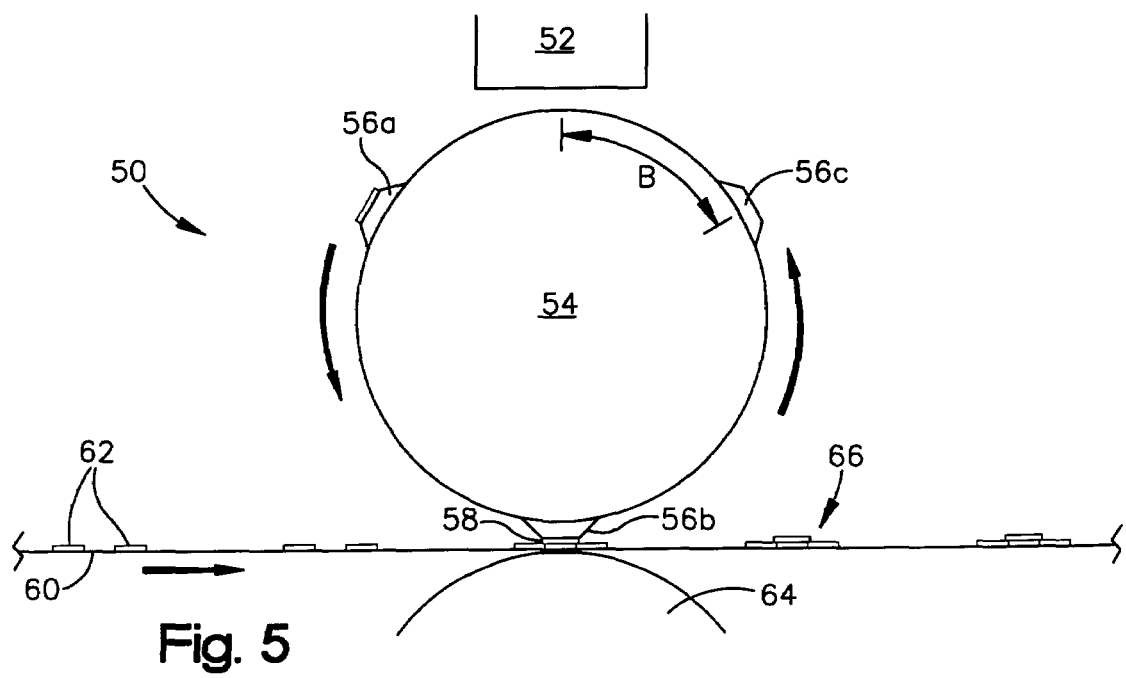
FIG. 5 is a partial side elevation view of the single drum, three nozzle placement device of FIG. 4, shown disposed in a second rotational position.

Turning now to FIGS. 4 and 5, a high-speed placement device 50 having a three nozzle transfer drum 54 is illustrated. In this particular embodiment the nozzles 56a, 56b, 56c are arranged around the circumference of the transfer drum 54 at 120 degree intervals. Thus, nozzle 56a is positioned at 12 o'clock, nozzle 56b is positioned at 8 o'clock, and nozzle 56c is positioned at 4 o'clock, as illustrated in FIG. 4. An RFID circuit supply device 52 is located above the 12 o'clock position of the transfer drum 54. A web 60 of electrical components 62 moves from left to right below the transfer drum 54 via the base roller 64. In FIG. 4, the transfer drum 54 is momentarily stationary, allowing nozzle 56a to pick up an RFID circuit 58 from the supply device 52.

Once the RFID circuit 58 is separably coupled to the nozzle 56a, the transfer drum 54 commences accelerating counter-clockwise rotation. In the three nozzle embodiment illustrated, the transfer drum 54 must accelerate from stationary to placing velocity, possibly rotating intermediately with a higher velocity than the placing velocity, and then decelerate back to stationary through an arc of 120 degrees. Thus, as shown in FIG. 4, the transfer drum 54 must achieve placing velocity within the 60 degree arc A, thereby rotating nozzle 56b to the 6 o'clock position for placing the RFID circuit 58 previously picked up from the RFID circuit supply device 52. The tangential velocity of the RFID circuit 52 separably coupled to nozzle 56b when it reaches the 6 o'clock position is substantially equal to the linear velocity of the moving web 60 of electronic components 62. After the RFID circuit 58 is placed, the transfer drum 54 decelerates to zero RPM's within the 60-degree arc B shown in FIG. 5, possibly rotating intermediately with a higher velocity than the placing velocity, thereby bringing nozzle 56c to the 12 o'clock position.

It will be appreciated that in the present embodiment, the transfer drum 54 intermittently rotates in 120-degree increments. During each 120 degree increment, a first nozzle in the 12 o'clock position, which may be anyone of nozzles 56a, 56b, or 56c, picks up an RFID circuit 58 from the supply device 52 when the transfer drum 54 is stationary. The transfer drum 54 then accelerates through an arc of 60 degrees until a second nozzle 56a, 56b, or 56c as appropriate is rotating, such that the tangential velocity of the nozzle is substantially equal to the linear velocity of the moving web 60, at which time an RFID circuit 58 is transferred to an electrical component 62 on the web 60. After the RFID circuit 58 is placed, the transfer drum 54 decelerates over a 60 degree arc until a third nozzle 56a, 56b, or 56c as appropriate is rotated into position to pick up an RFID circuit 58 from the supply device 52. As above, it will be appreciated that other configurations of nozzles and/or multiple RFID circuit supply devices 52 are possible. Further, while the above description begins with nozzle 56a in the 12 o'clock position, anyone of the nozzles 56a, 56b, or 56c could begin in the 12 o'clock position, with the remaining two nozzles assuming the remaining two relative positions as appropriate. Therefore, the above description describes but one of a many possible nozzle configurations that may be used in conjunction with the present invention.

As an alternative to the above described transfer drum configuration including three nozzles, other configurations and numbers of nozzles are possible. Configurations with odd numbers of nozzles, evenly spaced around the transfer drum, are compatible with the preferred type of velocity profile in which the transfer drum receives RFID devices at the 12 o'clock position while stationary, accelerates to the placing velocity at the 6 o'clock position and back to zero RPM's at the 12 o'clock position (possibly including over a series of sub-cycles, as illustrated in FIGS. 3A, 3B). Configurations with even numbers of nozzles also are possible, such as a two nozzle configuration with dwell regions at nine o'clock (where RFID circuits are separably coupled to the transfer drum) and at three o'clock. However, as will be appreciated by those of skill in the art, increasing the number of nozzles beyond a few may be undesirable as it would reduce the angular interval over which transfer drum acceleration and deceleration would occur, and hence, increase the required amount of acceleration and deceleration of the drum.

It will further be appreciated that, to aid in placement of the RFID circuits onto the antenna structures, vision systems may be advantageously employed to read fiducial marks and/or antenna positions and provide feedback to the control systems controlling the transfer drum, the RFID circuit carrier web, and/or the web of antenna structures. Further, any suitable method may be used to singulate the RFID circuits from the carrier web. For example, the carrier web may be die cut, thereby singulating the RFID circuits prior to picking by the transfer drum. Alternatively, the carrier web may pass between a cutter member and the transfer drum, wherein the cutter member singulates the RFID circuits by cutting the web using the transfer drum as an anvil.

The placing device described above enables RFID circuits of a first pitch (typically, relatively small) on a first carrier web to be transferred to antennas or other electrical components on a second web having a second pitch (typically, relatively large), with no change in speed of the second web. The RFID circuit carrier web may have constant, intermittent or variable speed as required to provide a suitable number of RFID circuits to the transfer drum. Similarly, the transfer drum may have constant, intermittent, or variable rotational speed as required to receive adequate RFID circuits from the carrier web and supply adequate RFID circuits to the second web.

It will be appreciated that in anyone of the above embodiments, the tangential or peripheral velocity of an RFID circuit separably coupled to a transfer drum may be substantially equal to the linear velocity of a moving web during placement. Throughout the foregoing description, reference has been made to a tangential or peripheral velocity of a drum's surface being substantially equal to a linear velocity of a web when an RFID circuit is placed onto an electrical component on the web. However, in some configurations, particularly in a configuration employing nozzles that extend outward from the peripheral surface of a drum, it will be appreciated that it is the tangential velocity of the nozzles and/or RFID circuits separably coupled thereto that is substantially equal to the linear velocity of the moving web of electrical components.

Therefore, it will be understood that a drum's surface is intended to be the surface to which an RFID circuit is separably coupled.

It will be further appreciated that during the placement of an RFID circuit onto an antenna structure, a permanent bond may be formed between the RFID circuit and antenna structure. In an alternative embodiment adapted to high-speed motion of the antenna web, the RFID circuit may be temporarily secured to an antenna structure, and a permanent bond may be formed between these structures in a subsequent process. For example, pressure may be used for temporary securement, and a permanent bond may be formed using heat, actinic radiation or other means in subsequent processing.

Figure 6:
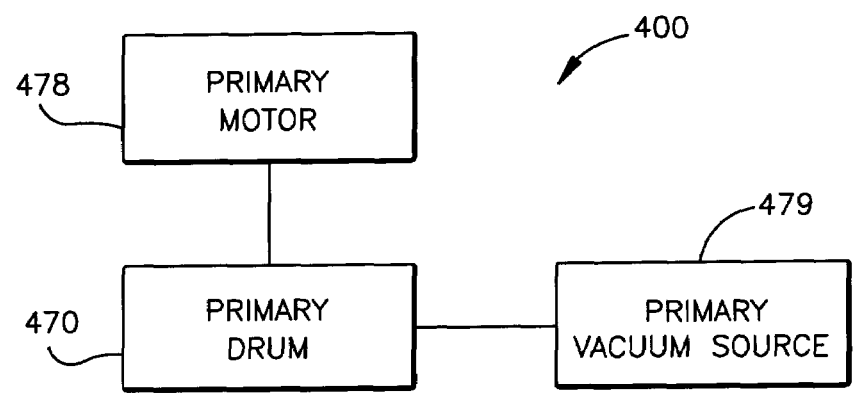
FIG. 6 is a schematic block diagram of an exemplary embodiment of the apparatus of the present invention.

In FIG. 6, a schematic diagram illustrates a placement device 400 including a transfer drum 470, a motor 478 coupled to the transfer drum 470, and a vacuum source 479 coupled to the transfer drum 470. Any suitable motor may be used to provide rotational force to the transfer drum 470. For example, electric stepper or servo driven motors or hydraulic motors may be coupled to the drums to provide rotational force. In addition, suitable gearing and transmission assemblies may be used to couple a motor or other drive means to the drum.

Figure 7:
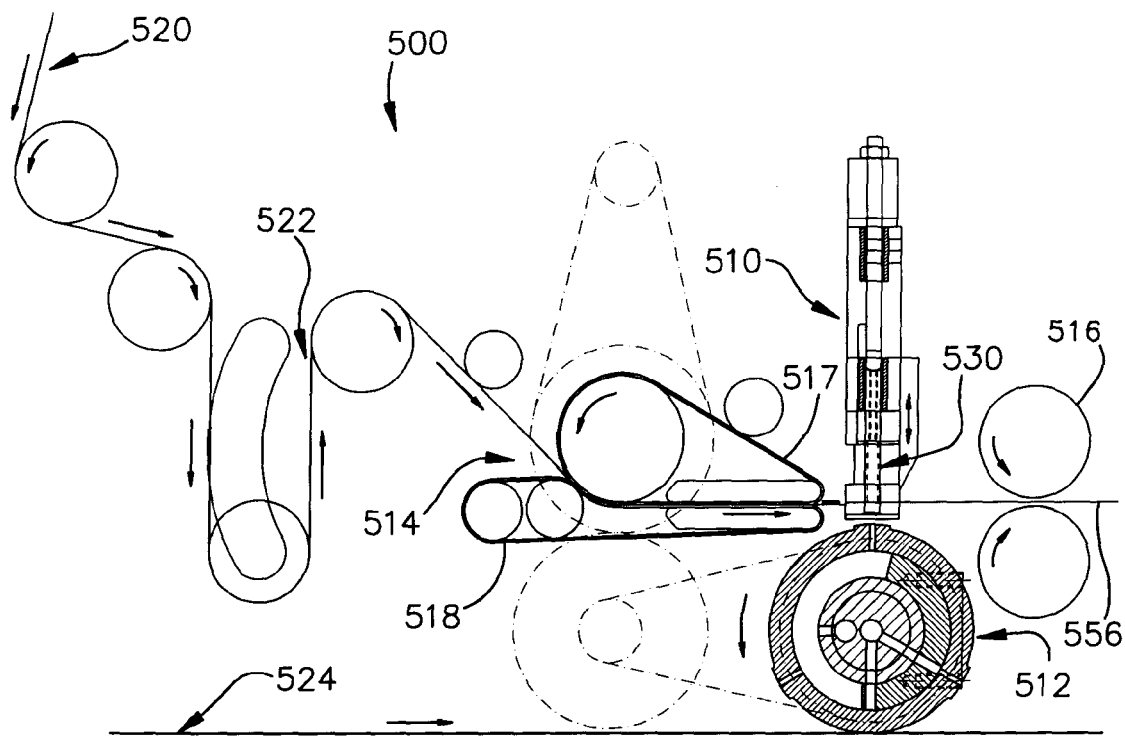
FIG. 7 is a partial side elevation view of another exemplary embodiment of apparatus in accordance with the present invention.
Figure 8:
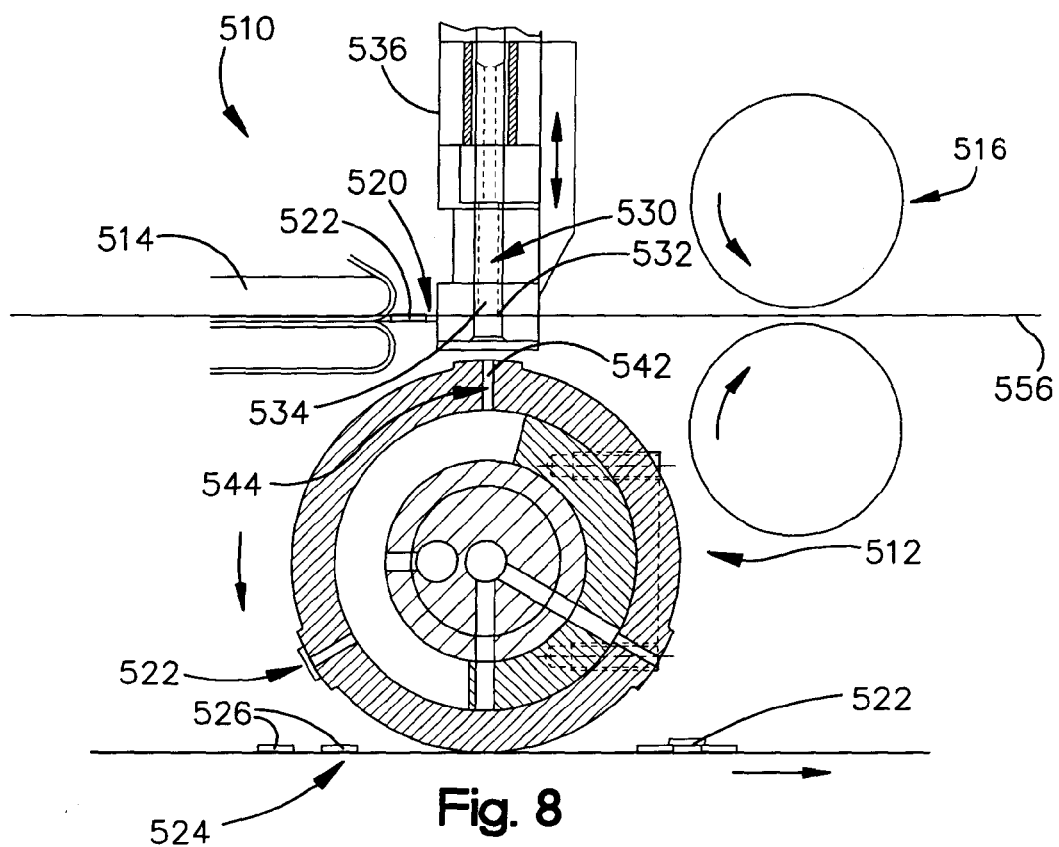
FIG. 8 is an enlarged detail view of the apparatus of FIG. 7.

Turning now to FIGS. 7 and 8, another exemplary embodiment of a high-speed placement device 500 is shown, including an interposer separator device 510, a rotary transfer drum 512, a web advancement device 514, and a scrap interposer web removal device 516. The rotary transfer drum 512 may be similar in operation to the transfer drums described above. In operation, the web advancement device 514, in cooperation with the scrap web removal device 516, advances a web of interposers 520 as appropriate from left to right through the machine 500.

It will be appreciated that the web advancement device 514 in the illustrated embodiment is located upstream of the interposer separator device 510 while the scrap interposer web removal device 516 is located downstream of the interposer separator device 510. The web advancement device 514 and scrap web removal device 516 may be nip rollers, belts, or any suitable device for advancing a web of material therethrough. In the illustrated embodiment, the advancement device 514 includes a pair of opposing belts that may compressively or otherwise engage the interposer web 520 to advance the interposer web 520 therethrough. The scrap web removal device 516 includes a pair of opposing wheels or drums that also compressively or otherwise engage the interposer web 520 to advance the interposer web 520 therethrough.

It will be appreciated that the advancement device 514 and scrap web removal device 516 cooperate to advance the interposer web 520 through the interposer separator device 510. In some cases, particularly when the web 520 is thin and/or flexible, it can be advantageous to operate the scrap web removal device 516 so as to prevent buckling of the interposer web 520 as the web 520 is advanced through the interposer separator device 510 by the advancement device 514. This may be achieved by operating the scrap interposer web removal device 516 at a rate equal or slightly greater than the rate at which the advancement device 514 advances the web 520. In doing so, a slight tension can be imparted or maintained in the web 520 thereby preventing buckling. Thicker and/or more rigid interposer webs 520 may not require the assistance of the scrap interposer web removal device 516 to prevent buckling.

In some applications, it can be advantageous to advance the web 520 using only the scrap web removal device 516 to pull the strap web 520 through the interposer separator device 510. In such applications, the web advancement device 514 can be disengaged from the web 520 or removed from the high-speed machine 500 altogether.

The interposers 521 on the interposer web 520 are singulated and transferred from the interposer web 520 to the rotary transfer drum 512 by the separator device 510. Once an interposer 521 is transferred to the rotary transfer drum 512, the rotary transfer drum 512 rotates and places the interposer 521 on to a web of antenna devices 526 or other electrical components in substantially the same manner as in the embodiments described above.

As shown in FIG. 7, a web of interposers 520 is wound through a series of rollers and tension adjustment stages prior to entering the web advancement device 514. The series of rollers and tension adjustment stages can be used to ensure that the web of interposers 520 is suitably aligned and at a proper tension prior to entering the web advancement device 516. At predetermined intervals, the web of interposers 520 is fed into the separator device 510 by the web advancement device 514. Suitable position detection (sensors) of the interposers 521 may influence the above mentioned predetermined interval resulting in a more favorable positioning of the interposer 521 in the separator device 510. The web advancement device 514 includes an upper belt 517 and a lower belt 518 that cooperate to intermittently advance the web of interposers 520 into the separator device 510. The advancement device 514 advances the web of interposers 520 such that an interposer 521 is suitably positioned for separation from the web of interposers 520 by the separator device 510.

The separator device 510 includes a punch 530 having a cutting end 532 and a vacuum port 534. The punch 530 is mounted in a separator device housing 536 and is configured for reciprocal orthogonal movement relative to the transfer drum 512 to effect a cutting or punching action. The cutting end 532 of the punch 530 is configured to singulate an interposer 521 from the interposer web 520 when the punch 530 is forced against the interposer 521 and/or interposer web 520. Once singulated from the interposer web 520, a singulated interposer 521 may be separably coupled to the punch 530 via the vacuum port 534. Separably coupling the singulated interposer 521 to the punch 530 may be advantageous for stabilizing the singulated interposer 521 during subsequent movement of the punch 530.

It will be appreciated that the housing 536 of the separator device 510 can include a guide or guides for guiding and/or aligning the interposer web 520 as the web is advanced through the separator device 510. For example, such guides can be an appropriately sized slot or channel in the housing 536 through which the interposer web 520 is directed. To accommodate interposer webs 520 of different dimensions, the guides can be adjustable or, alternatively, the guides can be of an interchangeable design whereby a guide or guides can be installed in the housing 536 for use with an interposer web 520 of a particular size.

After the separator device 510 singulates an interposer 521 from the interposer web 520, the punch 530 continues extending downward thereby directing the singulated interposer 521 onto a nozzle 542 on the rotary transfer drum 512. The singulated interposer 521 may then be transferred to the nozzle 542 of the rotary transfer drum 512 by simultaneously removing the vacuum from the vacuum port 534 on the punch 530 and applying a vacuum to the interposer 521 via the vacuum port 544 on the nozzle 542 of the rotary transfer drum 512. The singulation and transfer of an interposer 521 from the interposer web 520 can be effected while the interposer web 520 and the rotary transfer drum 512 are momentarily stationary.

As described in previous embodiments, once the interposer 521 is singulated and transferred to a nozzle 542 of the rotary transfer drum 512, the rotary transfer drum 512 may commence accelerating rotation such that the tangential velocity of the nozzle 542 is substantially equal to the linear velocity of the web of electrical components 524 when the nozzle is at the 6 o'clock position of the transfer drum 512. The singulated interposer 521 may then be placed onto the web of electrical components in the manner described previously.

It will be appreciated that the interposer 521 may be severed from the web of interposers 520 in any suitable manner, such as by cutting or punching. Thus, the punch member 530 can be configured to cut, shear, punch or otherwise separate interposers 521 from the web 520. A laser can also be used to separate an interposer 521 from the web 520. In some applications, the interposer 521 may be singulated from the web of interposers 520 by crosscutting the web 520. In such case, the singulated interposer 521 including the portion of the web 520 containing the same is transferred to the rotary transfer drum 512 for placement on the web of electrical components 524, and the scrap interposer web removal device 516 is not necessary. In other applications, the interposer 521 may be singulated from the web of interposers 520 leaving behind a portion or all of the web 520. In such case, the scrap interposer web removal device 516 may be employed to remove the scrap web.

In FIG. 9, an oblique view of another exemplary embodiment in accordance with the present invention is shown. The high-speed machine 500 includes an interposer separator device 510, a rotary transfer drum 512, and an advancement device 514 located upstream of the interposer separator device 510. A scrap interposer web removal device 516 is located downstream of the interposer separator device 510. The rotary transfer drum 512 may be similar in operation to the transfer drums described above. In operation, the advancement device 514, in cooperation with the scrap web removal device 516, advances a web of interposers 520 as appropriate from left to right through the machine 500.

It will be appreciated that the advancement device 514 in the illustrated embodiment is located upstream of the interposer separator device 510 while the scrap interposer web removal device 516 is located downstream of the interposer separator device 510. Similar to the previous embodiment, the advancement device 514 and scrap web removal device 516 may be nip rollers, belts, or any suitable device for advancing a web of material therethrough.

It also will be appreciated that the advancement device 514 and scrap web removal device 516 can cooperate to advance the interposer web 520 through the interposer separator device 510. In some cases, particularly when the web 520 is thin and/or flexible, it can be advantageous to operate the scrap web removal device 516 so as to prevent buckling of the interposer web 520 as the web 520 is advanced through the interposer separator device 510 by the web advancement device 514. This can be achieved by operating the scrap interposer web removal device 516 at a rate equal or slightly greater than the rate at which the web advancement device 514 advances the web 520. In doing so, a slight tension can be imparted or maintained in the web 520 thereby preventing buckling. Thicker and/or more rigid interposer webs 520 may not require the assistance of the scrap interposer web removal device 516 to prevent buckling.

In connection with the removal of the scrap interposer web 556, a sheeter 570 and a receptacle 572, located downstream of the scrap interposer web removal device 516, can be employed to sever and discard the scrap interposer web. The sheeter 570 can be a blade, laser, or any other suitable device for severing the web 520. A receptacle 572 can be configured to receive the severed scrap interposer web. It will be appreciated that any suitable method of removing the scrap interposer web 556 may be employed including a vacuum or spooler device.

The scrap interposer web removal device 516 may also remove interposers 521 that are determined to be defective. For example, prior to separating an interposer 521 from the web 520, the interposer 521 can be tested to determine whether the interposer is defective. If the interposer 521 is determined to be defective, the known defective interposer 521 may be advanced beyond the punch 530 by the advancement device 514 until the known defective interposer 521 is downstream of the scrap interposer web removal device 516. The sheeter may then sever the scrap interposer web portion 556 containing the known defective interposer. The scrap interposer web portion 556 containing the known defective interposer 521 may then be collected in the receptacle or otherwise removed in a suitable manner, such as with a vacuum. Alternatively, a vacuum take-up spooler or a driven rewinder can also be employed to remove scrap interposer web portion 556 without the need for the sheeting operation.

It will be appreciated that the interposers 521 may be tested immediately prior to being advanced into the interposer separator device 510 and advanced through the interposer separator device 510 without being separated from the web 520 if determined to be defective. Alternatively, an interposer web 520 may be tested and the positions of defective interposers 521 can be marked on the web 520 or stored in a memory device. The web advancement device 514 can include suitable vision systems to read the marked defective interposers 521. Alternatively, a control system can be employed to control the web advancement device 514 and, utilizing the data stored in the memory device, advance the web 520 in a manner that ensures only non-defective interposers 521 are singulated from the web 520. The remaining defective interposers 521 can be removed by the scrap web removal device 516.

As shown in FIG. 10, the interposers 521 on the interposer web 520 generally include a chip 522 and leads 523. The leads 523 typically are relatively coplanar with the interposer web 520 with the chip 522 extending upwardly from the interposer web 520. The interposers 521 are singulated and transferred from the interposer web 520 to the rotary transfer drum 512 by the separator device 510 such that the chip 522 of the interposer 521 is positioned on the transfer drum 512. Once an interposer 521 is transferred to the rotary transfer drum 512, the rotary transfer drum 512 rotates and places the interposer 521 on to a web 524 of antenna components 526 or other electrical components in substantially the same manner as in the embodiments described above.

As shown in FIG. 9, the web of antenna devices 526 can include a recess 527 between the antenna portions configured to receive the chip 522 when the interposer 521 is placed on the web 524, thereby achieving a relatively flat profile as shown in FIG. 11.

In the embodiment of FIGS. 9-11, the interposers 521 are arranged with the chip 522 oriented upwardly as they enter the interposer separator device 510. The singulated interposers 521 are separably coupled to the rotary transfer drum 512 with the chip 522 oriented radially outwardly from the surface of the rotary transfer drum 512. Once transferred to the web 524, the interposers are oriented with the chip 522 facing downwardly. As mentioned, the interposer 521 can be placed on the web 524 with the chip 522 in a recess 527.

Figure 12:
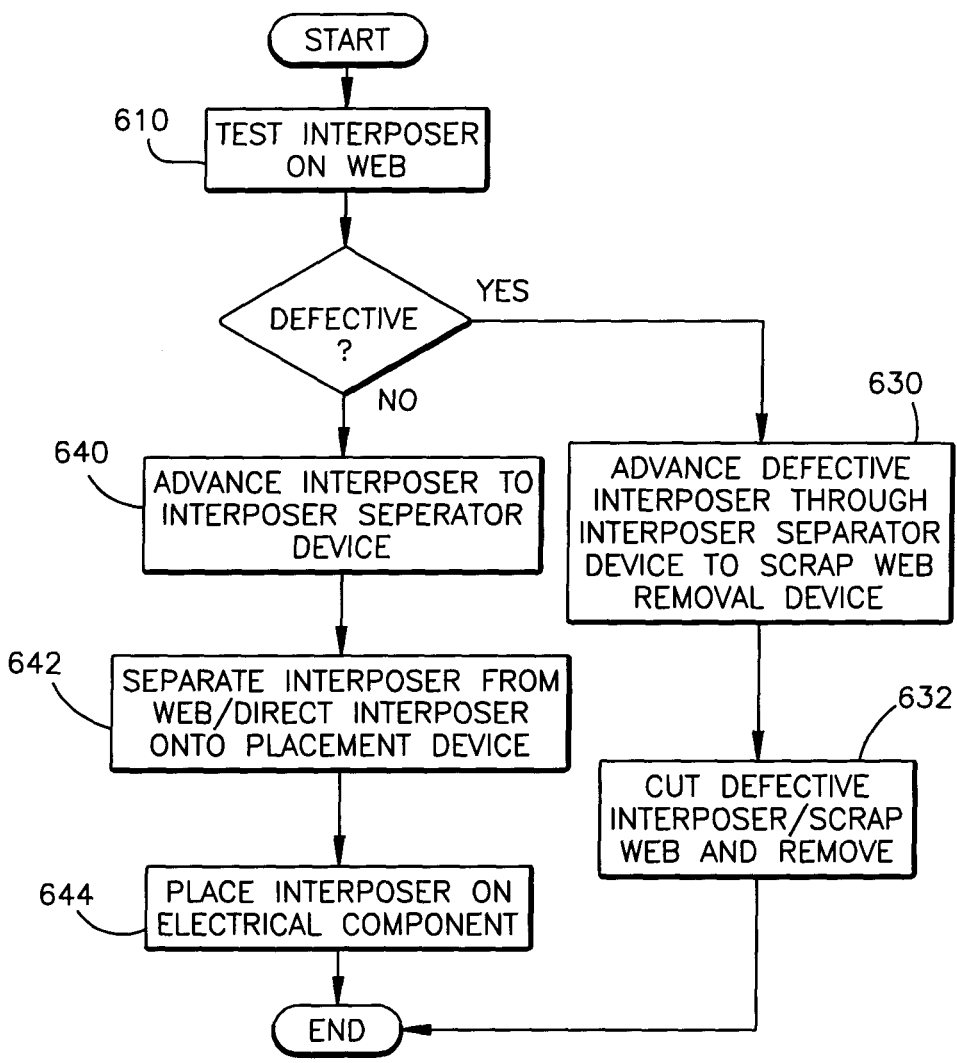
FIG. 12 is a flow chart illustrating a method in accordance with an exemplary embodiment of the present invention.

Turning to FIG. 12, a flowchart of the interposer testing process 600 is shown. The process begins with process step 610 wherein an interposer is tested. Any suitable testing device may be used to test a wide variety of interposer parameters to determine whether an interposer is defective. If the interposer is determined to be defective, or a pretested and marked defective interposer is identified, the web of interposers is advanced through the interposer separator device without singulation from the web, such that the defective interposer is positioned downstream of the interposer separator device 510 in process step 630, and such that only known good interposers are singulated from the interposer web for placement onto antennas. In process step 632, the defective interposer is removed by the scrap interposer removal device. If the interposer is determined to be good, the interposer is positioned within the interposer separator device in process step 640. In process step 642, the interposer is separated from the web of interposers and directed onto a placement device. The interposer is then placed on an electrical component in process step 644.

It will be appreciated that suitable interposer testing devices and methods may be employed to identify a defective interposer prior to the interposer being separated from the web of interposers by the punch. When a defective interposer is detected, the advancement device may advance the web of interposers 520 at a faster rate such that a known good interposer is present in the separator device 510 without delay. For example, where the pitch between interposers 521 on the interposer web 520 is X and the rate of advance of the interposer web 520 is Y, upon detection of a defective interposer the advancement device 516 would advance the web 520 a distance two times X at a rate twice the speed Y. In this manner, an interposer 521 will be in position for singulation and placement without the need to delay subsequent operations and/or without wasting other materials. This arrangement may be particularly advantageous in connection with the rotary transfer drums described in this application wherein the web of electrical components to which the interposers are ultimately placed is moving.

It will be appreciated that in any of the above embodiments, the interposer separator device may singulate an interposer or, alternatively, a plurality of interposers may be separated from the web of interposers as desired.

Certain modifications and improvements will occur to those skilled in the art upon a reading of the foregoing description. It should be understood that the present invention is not limited to any particular type of wireless communication device, or interposers. The term "electrical component" may comprise an electrical circuit or an electrical device, and in the preferred embodiment comprises an antenna. The antenna may include a single antenna portion, or a plurality of separate antenna portions. Further, a wide variety of antenna designs may be used with the present invention such as loop, slot, or patch antennas. For the purposes of this application, couple, coupled, or coupling may encompass both mechanical coupling and electrical coupling. Mechanical coupling includes physically securing the interposer to an electronic component. Electrical coupling includes forming an electrical connection between the interposer and the electronic component. The electrical connection between the interposer and the electronic component may comprise an ohmic, capacitive, or inductive connection, or combinations of the foregoing. Reactive coupling is defined as either capacitive or inductive coupling, or a combination of both. Capacitive coupling may involve placing the interposer into close proximity with an electronic component, with dielectric pads disposed therebetween, to enable capacitive coupling between the interposer and the electronic component to occur at RF Signal frequencies. The dielectric pads may include a non-conductive adhesive, such as a pressure-sensitive adhesive, for example Fasson adhesives 84800 and 8333, available from Avery Dennison Corporation, and a high dielectric constant material, such as a titanium compound, for example, titanium dioxide or barium titanate. In such an embodiment, the dielectric pads have an effective dielectric constant that is a non-constant function of the thickness of the dielectric pads. For example, the dielectric pads may include conductive particles, such as aluminum and/or nickel particles, to minimize the effect of changes in thickness on the capacitive coupling. The dielectric pads may have a thickness of about 0.025 mm (0.001 inches) or less.

As those of skill in the art will appreciate, the methods of the invention, though described in relation to RFID circuits, straps, interposers and antenna structures, may be used advantageously for placing chips directly to antennas, or for placing chips onto interposer leads. For example, in any of the above embodiments, interposer leads may be substituted for an antenna structure, and a chip may be placed onto the interposer leads instead of on an antenna structure.

One of ordinary skill in the art will recognize that there are different manners in which these elements can accomplish the present invention. The present invention is intended to cover what is claimed and any equivalents. The specific embodiments used herein are to aid in the understanding of the present invention, and should not be used to limit the scope of the invention in a manner narrower than the claims and their equivalents.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (I.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making an RFID device, comprising:
    testing an RFID circuit that is on a web of RFID circuits;
    if the RFID circuit is determined by the testing to be non-defective, positioning the non-defective RFID circuit in an RFID circuit separation device;
    separating the non-defective RFID circuit from the web of RFID circuits with a singulating member;
    directing the non-defective RFID circuit onto a rotary placement device and holding the non-defective RFID circuit with a negative pressure with a singulating member; and
    placing the non-defective RFID circuit onto an electrical component with the rotary placement device;
    if the RFID circuit is determined by the testing to be defective, advancing the defective RFID circuit to a scrap RFID web removal device; and
    removing the defective RFID circuit from the web, with the scrap RFID web removal device.

2. The method of claim 1, wherein the step of advancing the defective RFID circuit on the web includes advancing the defective RFID circuit to a location downstream of the RFID circuit separation device.

3. The method of claim 1, wherein the step of removing the defective RFID circuit with the scrap RFID web removal device includes cutting the web of RFID circuits.

4. The method of claim 1, wherein the step of removing the defective RFID circuit with the scrap RFID web removal device includes collecting the scrap RFID circuit web in a receptacle.

5. The method of claim 1, wherein the RFID circuit is provided on a strap or interposer.

6. The method of claim 1, wherein the step of separating includes severing the RFID circuit from the web RFID circuits and directing the RFID circuit onto the rotary placement device.

7. The method of claim 1, wherein the web of RFID circuits is advanced cooperatively with the scrap RFID web removal device through the RFID circuit separation device.

8. The method of claim 1, further comprising separably coupling the non-defective RFID circuit to the singulating member while directing the non-defective RFID circuit to the rotary placement device.

9. A method of making an RFID device, comprising the steps of:
advancing a web of RFID circuits at a first speed;
testing each of the RFID circuits;
if the RFID circuit is determined by the testing to be non-defective, positioning the non-defective RFID circuit in an RFID separation device;
rotating a rotary placement device to pick up the non-defective RFID circuit from the RFID separation device at the first speed;
transferring the non-defective RFID circuit from the rotary placement device to an electrical component web at a second speed;
if the RFID circuit is determined by the testing to be defective,
advancing the defective RFID circuit to a scrap RFID web removal device; and
moving the web of RFID circuits and scrap RFID web removal device cooperatively with one another.

10. The method of claim 9, wherein the first speed is different than the second speed.

11. The method of claim 9, wherein the electrical component web is a web of antennas.

12. The method of claim 9, including a further step of die cutting the web of RFID circuits after the step of advancing to form singulated RFID circuits.

13. The method of claim 9 wherein the web of RFID circuits is provided at a first pitch and the electrical component web has a second pitch different than the first pitch.

14. The method of claim 9, including a further step of bonding the non-defective RFID circuit to the electrical component web after the step of transferring.

15. The method of claim 14, wherein the step of bonding is accomplished by one of heat, adhesive, pressure, actinic radiation or combinations thereof.

16. The method of claim 9, wherein the step of rotating the rotary placement device is performed at different speeds.

17. A method of making an RFID device, comprising the steps of:
advancing a web of RFID circuits at a first speed;
testing each of the RFID circuits;
marking each RFID circuit that is defective;
reading each of the RFID circuits on the web;
if the RFID circuit is determined by the testing to be non-defective, positioning the non-defective RFID circuit in an RFID separation device;
moving a placement device to pick up the non-defective RFID circuit from the RFID separation device at the first speed;
transferring the non-defective RFID circuit from the placement device to an electrical component web at a second speed;
if the RFID circuit is determined by the testing to be defective; and advancing the defective RFID circuit to a scrap RFID web removal device.

18. The method of claim 17, wherein the separation device includes singulating the RFID circuit from the web of RFID circuits.

19. The method of claim 17, wherein the web of RFID circuit has a first pitch and the electrical component web has a second pitch difference than the first pitch.

20. The method of claim 19, wherein the first pitch is greater than the second pitch.

* * * * *